United States Patent
Mizukami

(10) Patent No.: US 9,142,612 B2
(45) Date of Patent: Sep. 22, 2015

(54) SEMICONDUCTOR DEVICE AND METHOD OF FABRICATING THE SAME

(71) Applicant: KABUSHIKI KAISHA TOSHIBA, Minato-ku (JP)

(72) Inventor: Makoto Mizukami, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 85 days.

(21) Appl. No.: 14/023,287

(22) Filed: Sep. 10, 2013

(65) Prior Publication Data

US 2014/0284618 A1    Sep. 25, 2014

(30) Foreign Application Priority Data

Mar. 22, 2013   (JP) .................................. 2013-061146

(51) Int. Cl.
| | |
|---|---|
| H01L 31/0312 | (2006.01) |
| H01L 29/06 | (2006.01) |
| H01L 21/04 | (2006.01) |
| H01L 29/10 | (2006.01) |
| H01L 29/16 | (2006.01) |
| H01L 29/66 | (2006.01) |
| H01L 29/78 | (2006.01) |

(52) U.S. Cl.
CPC .......... *H01L 29/0619* (2013.01); *H01L 21/046* (2013.01); *H01L 29/1095* (2013.01); *H01L 29/1608* (2013.01); *H01L 29/66068* (2013.01); *H01L 29/7802* (2013.01)

(58) Field of Classification Search
CPC ............ H01L 29/7802; H01L 29/1095; H01L 29/1608; H01L 29/66068; H01L 29/0878; H01L 29/66666; H01L 21/0445; H01L 29/0619

USPC .............. 257/77, E29.104, E21.054, 60, 135, 257/263, 302, 328, 329, 334
See application file for complete search history.

(56) References Cited

U.S. PATENT DOCUMENTS

| | | |
|---|---|---|
| 6,054,352 A | 4/2000 | Ueno |
| 2005/0001217 A1 | 1/2005 | Kusumoto et al. |
| 2006/0134847 A1 | 6/2006 | Tarui et al. |
| 2009/0078942 A1 | 3/2009 | Kono et al. |
| 2012/0153362 A1 | 6/2012 | Stum et al. |

FOREIGN PATENT DOCUMENTS

| | | |
|---|---|---|
| JP | 2007-141940 A | 6/2007 |
| JP | 2009-277839 A | 11/2009 |
| JP | 2011-211232 A | 10/2011 |

OTHER PUBLICATIONS

Japanese Patent Official Action for Japanese Patent Application No. 2013-061146, dated May 21, 2015.

*Primary Examiner* — Thien F Tran
(74) *Attorney, Agent, or Firm* — White & Case LLP

(57) ABSTRACT

An aspect of the present embodiment, there is provided a semiconductor device, including a first electrode, a first semiconductor layer having a first conductive type connected to the first electrode, a second semiconductor layer having a second conductive type contacted to the first semiconductor layer, a third semiconductor layer having the first conductive type, an impurity concentration of the third semiconductor layer being smaller than an impurity concentration of the second semiconductor layer, the third semiconductor layer contacting to the second semiconductor layer to be separated from the first semiconductor layer by the second semiconductor layer, a gate insulator provided on the second semiconductor layer, and the first semiconductor layer and the third semiconductor layer arranged at both sides of the second semiconductor layer, respectively, a gate electrode on the gate insulator; and a second electrode connected to the third semiconductor layer.

10 Claims, 4 Drawing Sheets

SEMICONDUCTOR DEVICE AND METHOD OF FABRICATING THE SAME

CROSS REFERENCE TO RELATED APPLICATION

This application is based upon and claims the benefit of priority from prior Japanese Patent Application No. 2013-061146, filed on month day, 2013, the entire contents of which are incorporated herein by reference.

FIELD

Exemplary embodiments described herein generally relate to a semiconductor device and a method of fabricating the semiconductor device.

BACKGROUND

Conventionally, vertical MOSFETs have been used as power MOSFETs (Metal-Oxide-Semiconductor Field-Effect Transistor).

However, problems due to un-uniformity of a gate length have been generated in recent trend of miniaturization. As a result, stabilization of characteristics in the vertical MOSFETs has been lead to difficulty.

DETAILED DESCRIPTION

Figure 1A:
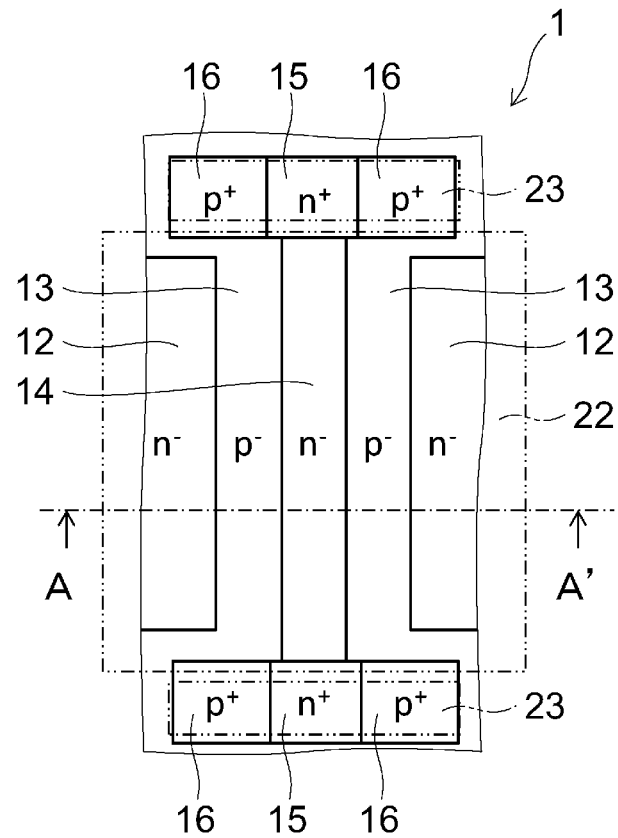
FIGS. 1A, 1B are a plane view and a cross-sectional view along A-A' line in FIG. 1A, respectively, showing a semiconductor device according to an embodiment.

An aspect of the present embodiment, there is provided a semiconductor device, including a first electrode, a first semiconductor layer having a first conductive type connected to the first electrode, a second semiconductor layer having a second conductive type contacted to the first semiconductor layer, a third semiconductor layer having the first conductive type, an impurity concentration of the third semiconductor layer being smaller than an impurity concentration of the second semiconductor layer, the third semiconductor layer contacting to the second semiconductor layer to be separated from the first semiconductor layer by the second semiconductor layer, a gate insulator provided on the second semiconductor layer, and the first semiconductor layer and the third semiconductor layer arranged at both sides of the second semiconductor layer, respectively, a gate electrode on the gate insulator; and a second electrode connected to the third semiconductor layer.

Another aspect of the present embodiment, there is provided a method of fabricating a semiconductor device, including providing an embedded area having a second conductive type in a first semiconductor layer having a first conductive type, implanting impurities having the second conductive type in a periphery portion of an area on the embedded area in the first semiconductor layer to provide a frame area, a lower end of the frame area reaching the embedded area and an upper end of the frame area reaching an upper surface of the first semiconductor layer, the frame area surrounding a central portion of the area above the embedded area, separating the central portion from a residual portion in the first semiconductor layer by constituting the embedded area and the frame area as a second semiconductor layer to provide a third semiconductor layer having the first conductive type, providing a gate insulator on the second semiconductor layer, and the first semiconductor layer and the third semiconductor layer arranged at both sides of the second semiconductor layer, respectively, providing a first electrode contacted to the first semiconductor layer, providing a gate electrode on the gate insulator, and providing a second electrode connected to the third semiconductor layer.

Embodiments will be described below in detail with reference to the attached drawings mentioned above. Throughout the attached drawings, similar or same reference numerals show similar, equivalent or same components, and the description is not repeated.

Embodiment

Figure 1B:
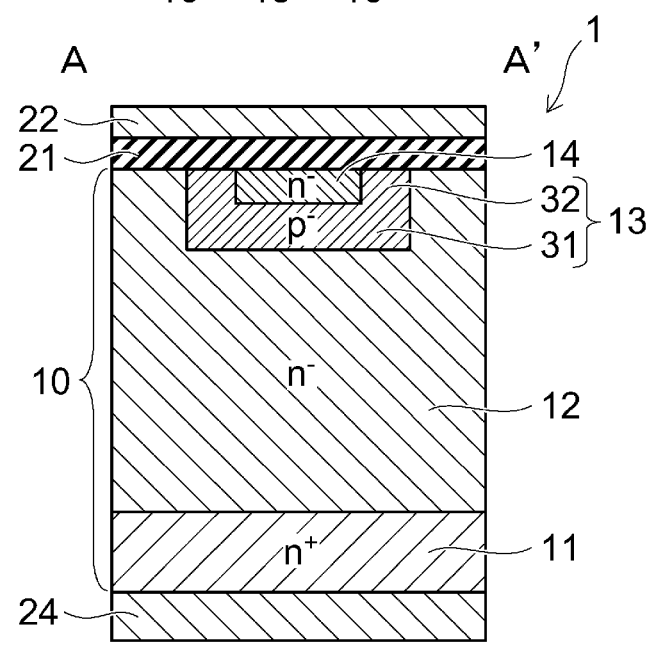

FIGS. 1A, 1B are a plane view and a cross-sectional view along A-A' line in FIG. 1A, respectively, showing a semiconductor device according to an embodiment. For showing easily the figure, a gate insulator 21 and a gate electrode 22 are not shown in FIG. 1A.

As shown in FIGS. 1A, 1B, an $n^+$ type drain layer 11 is provided in a semiconductor device 1 according to the embodiment, and an $n^-$ type drift layer 12 is provided on the $n^+$ type drain layer 11. In the specification, "$n^+$type" shows an $n^-$ type and an effective impurity concentration is higher than that of an $n^-$ type. A relation between "$p^+$type" and "$p^-$type" is the same as the above relation. The effective impurity concentration is an impurity concentration which contributes to conductivity of a semiconductor material. When both donor impurities and acceptor impurities are included, the concentration is defined as other than the compensated concentration between the donor impurities and the acceptor impurities.

A $p^-$type well 13 is provided on an upper portion of the drift layer 12. The well 13 is constituted with an embedded area 31 embedded in the drift layer 12 and a frame area 32 with a frame shape in a portion of an area on the embedded area 31, and the well 13 has a box shape with an opening at the upper portion. Further, an $n^-$type source layer 14 is provided in an area three-dimensionally surrounded by the well 13. From an upper point of view, a shape of the source layer 14 is a band type which extends in one direction. The source layer 14 is separated from the drift layer 12 by the well 13. The source layer 14 is constituted with the same semiconductor layer of the drift layer 12 to halfway in a fabricating process, described after. An impurity concentration of the source layer 14 is the same as that of the drift layer 12, for example. Furthermore, the impurity concentration of the source layer 14 is lower than that of the well 13. In such reasons, impurity diffusion from the source layer 14 to the well 13 can be prevented. As a result, a periodic arrangement of the source layers 14 can be shortened to obtain a finer pattern of a unit cell. Here, impurity concentration is not the effective impurity concentration described above, but the contained impurity concentration, which is simply summed up as atomic %, without compensating the two types.

An n+ type contact layer 15 is provided in a portion of area on the well 13, the source layer 14 is not provided in the area. The n+ type contact layer 15 is arranged at both sides of a longitudinal direction of the source layer 14, and the n+ type contact layer 15 is contacted to the source layer 14 and the well 13, but not contacted d to the drift layer 12. Furthermore, p+ type contact layer 16 is provided on the well 13 and at a position sandwiching the n+ type contact layer 15 in a width direction of the source layer 14. The p+ type contact layer 16 is contacted to the well 13 and the n+ type contact layer 15 but is not contacted to the drift layer 12.

The semiconductor substrate 10 is constituted with the drain layer 11, the drift layer 12, the well 13, the source layer 14, the n+ type contact layer 15 and the p+ type contact layer 16. The semiconductor substrate 10 is composed of single crystalline silicon carbide, for example.

A gate insulator 21 is provided on the semiconductor substrate 10. The gate insulator 21 covers a portion of the well 13 at upper portion of the semiconductor substrate 10 and a portion of the drift layer 12 arranged at both sides of the well 13 and the source layer 14.

The gate electrode 22 is provided on the gate insulator 21. The gate electrode 22 is constituted with poly crystalline silicon doped with impurities, for example.

A source electrode 23 is provided on a portion of an area on the semiconductor substrate 10, where the portion has not the gate insulator 21 thereon. The source electrode 23 is composed of metal, for example, and is contacted to the n+ type contact layer 15 and the p+ type contact layer 16. The source electrode 23 is connected to the source layer 14 through the n+ type contact layer 15 and is connected to the well 13 through the p+ type contact layer 16. Further, a drain electrode 24 is provided on a lower surface of the semiconductor substrate 10. The drain electrode 24 is composed of metal, for example, is contacted to the drain layer 11. The drain electrode 24 is connected to the drift layer 12 through the drain layer 11.

In such a manner, a vertical MOSFET is provided in the semiconductor device 1 according to the embodiment. In the semiconductor device 1, a plurality of the vertical MOSFETs can be arranged in the width direction of the source layer 14.

Figure 2A:
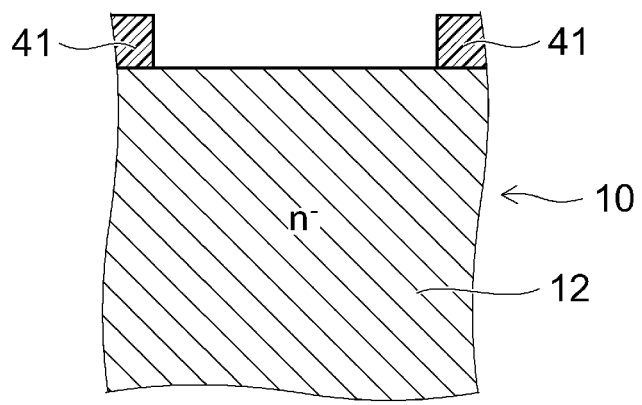
FIGS. 2A-2C are cross-sectional views showing a method of fabricating the semiconductor device according to the embodiment.
Figure 2B:
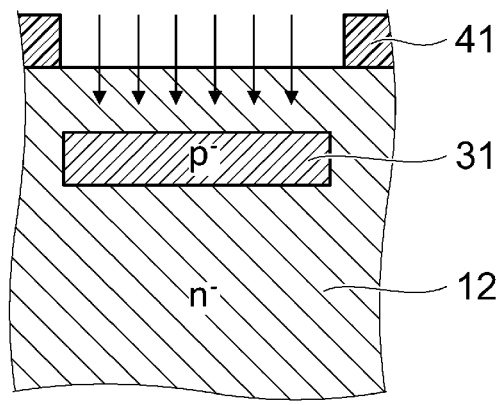
Figure 2C:
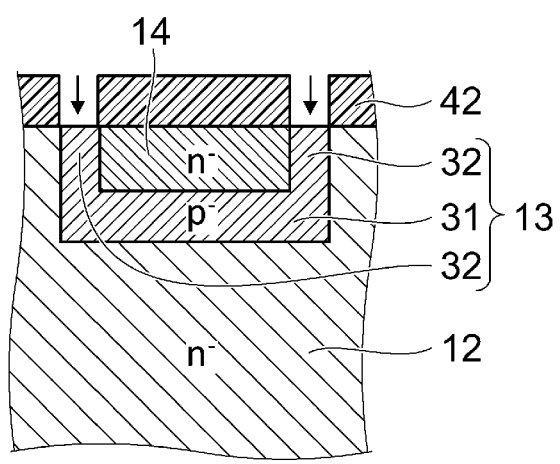

A method of fabricating a semiconductor device according to the embodiment is explained below. FIGS. 2A-2C are cross-sectional views showing a method of fabricating the semiconductor device according the embodiment.

As shown in FIG. 2A, a semiconductor substrate 10 in which an n⁻ type drift layer 12 is provided on an n+ type drain layer 11 is prepared as shown in FIG. 1B. The semiconductor substrate 10 is composed of silicon carbide, for example. On the other hand, the drain layer 11 is omitted in FIGS. 2A-2C. Next, a resist mask 41 is provided on the drift layer 12.

As shown in FIG. 2B, aluminum ions, for example, as an impurity acting as an acceptor in the drift layer 12 are ion-implanted into the drift layer 12 using the resist mask 41 as a mask. In such a manner, a p⁻ type embedded area 31 is provided in the drift layer 12. The embedded area 31 is not exposed on a surface of the drift layer 12. After the process described above, the resist mask 41 is removed.

As shown in FIG. 2C, a resist mask 42 is provided on the drift layer 12. Impurity ions acting as an acceptor in the drift layer 12 is ion-implanted into the drift layer 12 using the resist mask 42 as a mask. Impurity ions as the same kind of the impurity ions as shown in FIG. 2B are ion-implanted. On the other hand, an acceleration voltage in the ion implantation in FIG. 2C is lower than that of the ion implantation in FIG. 2B. In such a manner, impurities are ion-implanted in an area just above the embedded area 31 in the drift layer 12.

As a result, a p⁻ type frame area 32 is provided in the drift layer 12. A lower end of the frame area 32 reach the embedded area 31 and an upper end of the frame area 32 reach an upper surface of the drift layer 12. The frame area 32 surrounds the drift layer 12. The area surrounded by the frame area 32, namely, the central portion of the area on the embedded area 31 in the drift layer 12 is set to be a source layer 14. A lower surface of the source layer 14 is covered with the embedded area 31, a periphery of the source layer 14 is surrounded by the frame area 32, and an upper surface of the source layer 14 is exposed at the upper surface of the drift layer 12. In an upper point of view, a shape of the source layer 14 is a band structure extending one direction.

The p⁻ type well 13 is constituted with the embedded area 31 and the frame area 32. In such a manner, the source layer 14 is separated from a residual portion which is not set to be the source layer 14 in the drift layer 12 by the well 13. Hereinafter, only the residual portion is called the drift layer 12. In other words, the well 13 is necessarily set between the source layer 14 and the drift layer 12. After the processes described above, the resist mask 42 is removed. In such a manner, as aluminum ions is not ion-implanted into the source layer 14, a sum of the impurity concentration in the source layer 14 is lower than a sum of that of the well 13 in the embodiment, in a case that an impurity concentration of the well 13 is retained in uniformity before providing the drift layer 12.

As shown in FIGS. 1A, 1B, impurity ions acting as donors are ion-implanted in an area of the upper surface of the semi-conductor substrate 10 where the area is set to be along the both sides in a longitudinal direction of the source layer 14, and is contacted to the well 13 and the source layer 14 but not contacted to the n⁺ type contact layer 15. In such a manner, an n⁺ type contact layer 15 is provided in the area. Furthermore, impurity ions acting as acceptors are ion-implanted in an area of the upper surface of the semiconductor substrate 10 where the area is set to be portions sandwiching the n⁺ type contact layer in between in a width direction of the source layer 14, and is contacted to the well 13 and the n⁺ type contact layer 15 but not contacted to the drift layer 12. In such a manner, p+ type contact layer 16 is provided in the area.

Next, a gate insulator 21 is provided on the semiconductor substrate 10 to cover a portion of the frame area 32, for example, the finest portion, the drift layer 12 arranged in the both sides and the source layer 14. Further, a gate electrode 22 is provided on the gate insulator 21. A source electrode 23 is provided to contact to the n⁺ type contact layer 15 and the p⁺ type contact layer 16 but not to contact to the drift layer 12. A drain electrode 24 is provided on an under surface of the semiconductor substrate 10 to contact to the drain layer 11. In such a manner, a semiconductor device 1 is completed to be fabricated.

Figure 3:
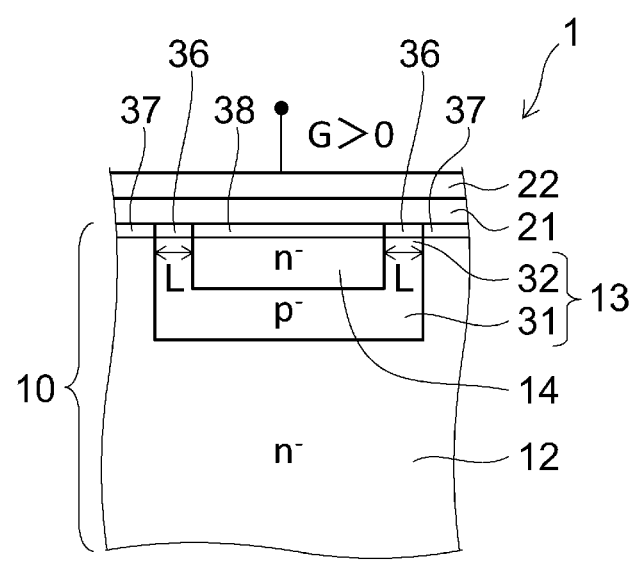
FIG. 3 is a cross-sectional view showing action of the semiconductor device according to the embodiment.

Next, action of the semiconductor device according to the embodiment is explained. FIG. 3 is a cross-sectional view showing the action of the semiconductor device according to the embodiment. As shown in FIGS. 1A, 1B, electrical current is not flowed between a source and a drain due to an extension of a depletion layer (not shown) originated at an interface between the n⁻ type drift layer 12 and the p⁻ type well 13 when a positive voltage is applied to the drain electrode 24, in a case that a same potential, for example, the earth potential is applied to the gate electrode 22 and the source electrode 23.

On the other hand, electrons are generated in a surface region of the semiconductor substrate 10 near the gate insulator 21 as shown in FIG. 3. In such a manner, an n type inversion layer 36 is quasi generated at a portion of the p⁻ type well 13 contacted to the gate insulator 21. As a result, the source layer 14 and the drift layer 12 are set to be conductive through the inversion layer 36. Further n⁺ type accumulation layers 37, 38 are quasi generated at a portion of the drift layer 12 and the source layer 14 contacted to the gate insulator 21. In such a manner, on-resistance between a source and a drain is decreased to flow electrical current there between. In such the situation, a width of a portion of frame area 32 in the well 13 becomes a gate length L, where the portion is sandwiched between the source layer 14 and the drift layer 12.

Effects of the embodiment are explained. As described above, the width of the frame area 32 is set to the gate length L of the vertical MOSFET. The width of the frame area 32 can be determined by ion implantation with one time as shown in FIG. 2C. Therefore, the gate length L can be precisely controlled. Accordingly, the semiconductor device according to the embodiment can obtain stable characteristics with relatively smaller variation even when a finer process is developed. Increasing of leakage current due to shorter gate length, increasing of on-resistance due to longer gate length, or the like can be prevented.

Further, the n+ type contact layer 15 and the p+ type contact layer 16 are not arranged in a unit cell placed with the drift layer 12, the well 13 and the source layer 14 in the embodiment. Accordingly, a finer unit cell can be obtained to increase a channel density.

The semiconductor substrate 10 is composed of silicon carbide in the embodiment, for example. However, it is not restricted to the above case. Silicon, silicon-germanium compound or the like can be used as the material of the substrate 10.

Figure 4A:
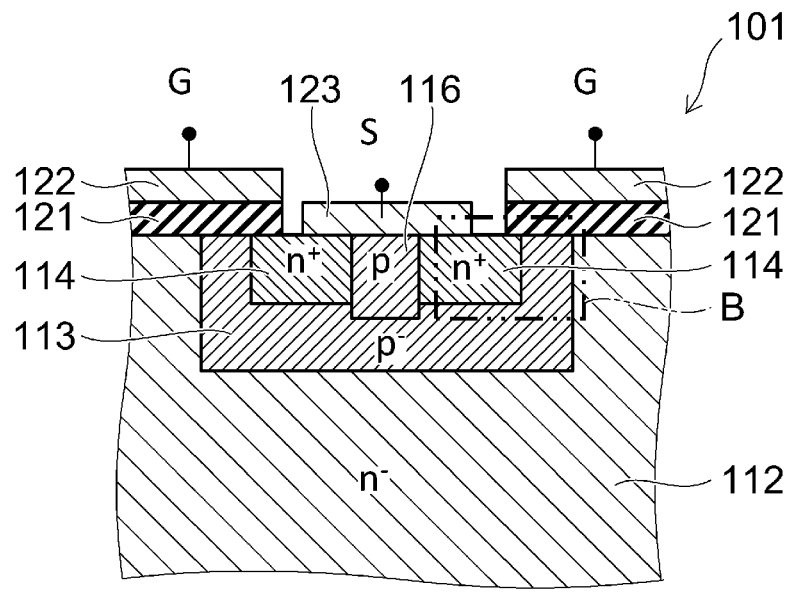
FIGS. 4A, 4B are a cross-sectional view and a partially enlarged cross-sectional view in an area B in FIG. 4A, respectively, showing a semiconductor device according to a comparative case.
Figure 4B:
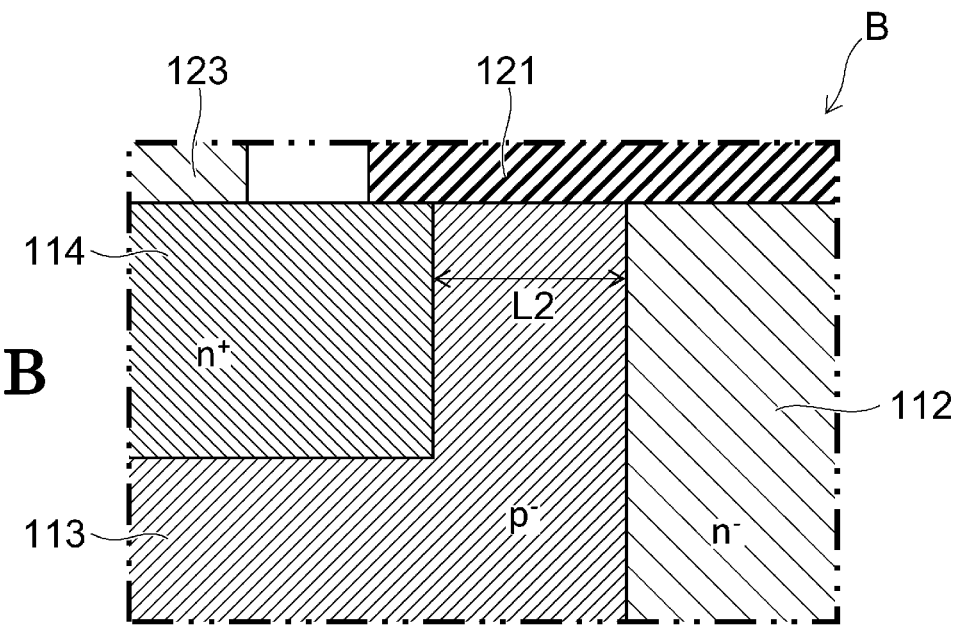

Next, a comparative case is explained. FIGS. 4A, 4B are a cross-sectional view and a partially enlarged cross-sectional view in an area B in FIG. 4A, respectively, showing a semiconductor device according to a comparative case.

As shown in FIGS. 4A, 4b, impurity ions acting as acceptors are ion-implanted into a portion of an upper layer of an n⁻ type drift layer 112 to provide a p⁻ type well 113 and impurity ions acting as donors are ion-implanted into a portion of an upper layer of a well 113 to provide an n⁺ type source layer 114. In such case, the impurity ions acting as the acceptors are ion-implanted into an area to be the n⁺ type source layer 114 in processing the well 113. As a result, a sum of the impurity concentration in the source layer 114 is larger than a sum of that in the well 113, after the semiconductor device 101 is completed.

Furthermore, a p type contact layer 116 is provided in an area in an upper portion of the well 113, the area contacting to the source layer 114. A gate insulator 121 is provided to cover a portion in the well 113, sandwiched between the drift layer 112 and the source layer 114, a portion of the drift layer 112 arrange at both sides of the portion in the well 113, and a portion of the source layer 114. A gate electrode 122 is provided on the gate insulator 121. A source electrode 123 is provided to contact to the source layer 114 and the p type contact layer 116. A drain electrode (not shown) is provided to contact to a drain layer (not shown).

In the comparative case, a portion in the well 113 sandwiched between the drift layer 112 and the source layer 114 is set to be a channel region and a width of the portion in the well 113 is set to be a gate length L2. The gate length L2 is determined by ion implantation with two times to provide the p⁻ type well 113 and to provide the n⁺ type source layer 114. In other words, the implantation with two times is necessary to set the gate length L2. Therefore, the length L2 is easily varied due to the origination of misalignment between two ion-implantation processes. Accordingly, characteristics of the semiconductor device 101 according to the comparative case are easily varied to relatively enlarge variation even when a finer process is developed.

A semiconductor device having smaller variation on a gate length and a method of fabricating the semiconductor device can be realized in the embodiment described above.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first electrode;
    a first semiconductor layer having a first conductive type connected to the first electrode;
    a second semiconductor layer having a second conductive type contacted to the first semiconductor layer;
    a third semiconductor layer having the first conductive type, an impurity concentration of the third semiconductor layer being smaller than an impurity concentration of the second semiconductor layer, the third semiconductor layer contacting to the second semiconductor layer to be separated from the first semiconductor layer by the second semiconductor layer;
    a gate insulator provided on the second semiconductor layer, and the first semiconductor layer and the third semiconductor layer arranged at both sides of the second semiconductor layer, respectively;
    a gate electrode on the gate insulator; and
    a second electrode connected to the third semiconductor layer.

2. The semiconductor device of claim 1, wherein
    the second semiconductor layer includes an embedded area arranged under the third semiconductor layer and a frame area arranged above a periphery portion of the embedded area, the frame area surrounding the third semiconductor layer.

3. The semiconductor device of claim 1, wherein
    a shape of the third semiconductor layer has a band structure from an upper point of view.

4. The semiconductor device of claim 3, further comprising:
    first contact layers arranged at both sides of the third semiconductor layer to a longitudinal direction of the third semiconductor layer, each of the first contact layers contacting to the third semiconductor layer, the second semiconductor layer and the second electrode.

5. The semiconductor device of claim 4, wherein
    the first contact layer has the first conductive type, and an effective impurity concentration of the first contact layer is higher than an effective impurity concentration of the third semiconductor layer.

6. The semiconductor device of claim 1, further comprising:
    second contact layers having the second conductive type, the second contact layers sandwiching the first contact layer to contact to both sides of the first contact layer and the second semiconductor layer.

7. The semiconductor device of claim 1, wherein
    the second electrode is composed of metal and contacts to the first contact layer and the second contact layer.

8. The semiconductor device of claim 1, wherein
the first semiconductor layer, the second semiconductor layer and the third semiconductor layer are composed of silicon carbide.

9. The semiconductor device of claim 1, wherein
the first conductive type is n type or p type and the second conductive type is the other type.

10. The semiconductor device of claim 1, wherein
an inversion layer is configured to be generated in the second semiconductor layer under the gate insulator and the first semiconductor layer and the third semiconductor layer are conducted through the inversion layer.

* * * * *